(12) United States Patent
Sakuma et al.

(10) Patent No.: US 9,118,031 B2
(45) Date of Patent: Aug. 25, 2015

(54) ORGANIC LIGHT-EMITTING DEVICE, COATING LIQUID FOR FORMING ORGANIC LIGHT-EMITTING DEVICE, MATERIAL FOR FORMING ORGANIC LIGHT-EMITTING DEVICE, LIGHT SOURCE DEVICE USING ORGANIC LIGHT-EMITTING DEVICE, AND ORGANIC LIGHT-EMITTING DEVICE PRODUCING METHOD

(75) Inventors: Hirotaka Sakuma, Hitachinaka (JP); Sukekazu Aratani, Hitachiota (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 13/881,094

(22) PCT Filed: Oct. 31, 2011

(86) PCT No.: PCT/JP2011/075076
§ 371 (c)(1),
(2), (4) Date: Jul. 17, 2013

(87) PCT Pub. No.: WO2012/060329
PCT Pub. Date: May 10, 2012

(65) Prior Publication Data
US 2013/0299788 A1    Nov. 14, 2013

(30) Foreign Application Priority Data

Nov. 2, 2010 (JP) ................................. 2010-245810

(51) Int. Cl.
*H01L 51/50* (2006.01)
*H01L 51/56* (2006.01)
*H01L 51/00* (2006.01)

(52) U.S. Cl.
CPC ............ *H01L 51/5028* (2013.01); *H01L 51/56* (2013.01); *H01L 51/007* (2013.01);
(Continued)

(58) Field of Classification Search
CPC .............. H01L 51/0067; H01L 51/007; H01L 51/0545
USPC ................................ 257/40, E27.117; 438/46
See application file for complete search history.

(56) References Cited

U.S. PATENT DOCUMENTS

2006/0214553 A1* 9/2006 Nagara et al. ................. 313/483
2008/0024054 A1* 1/2008 Itoh et al. ...................... 313/504
(Continued)

FOREIGN PATENT DOCUMENTS

JP  2006-279007 A  10/2006
JP  2007-042314 A   2/2007
(Continued)

*Primary Examiner* — Karen Kusumakar
*Assistant Examiner* — Adam S Bowen
(74) *Attorney, Agent, or Firm* — Volpe and Koenig, P.C.

(57) ABSTRACT

An organic light-emitting device includes a lower electrode, an upper electrode, and an organic layer disposed between the lower electrode and the upper electrode, the organic layer including a charge transport layer and a mixed layer in contact with the charge transport layer, the mixed layer including a host, a first dopant, and a charge transporting material, the first dopant including a first functional group, the charge transporting material including a second functional group, the first dopant being drawn to a charge transport layer contact surface where the mixed layer is in contact with the charge transport layer, and the charge transporting material being drawn to the mixed layer surface other than the charge transport layer contact surface. With the present invention, the concentrations of the molecules contained in the mixed layer of the light-emitting layer and the charge transport layer can be easily controlled.

19 Claims, 2 Drawing Sheets

(52) U.S. Cl.
CPC ......... *H01L51/0061* (2013.01); *H01L 51/0067* (2013.01); *H01L 51/0072* (2013.01); *H01L 51/0085* (2013.01); *H01L 2251/5346* (2013.01)

(56) References Cited

U.S. PATENT DOCUMENTS

| | | | |
|---|---|---|---|
| 2008/0176099 A1* | 7/2008 | Hatwar et al. | 428/690 |
| 2008/0197768 A1 | 8/2008 | Conway et al. | |
| 2010/0244677 A1* | 9/2010 | Begley et al. | 313/506 |

FOREIGN PATENT DOCUMENTS

| | | |
|---|---|---|
| JP | 2007-221132 A | 8/2007 |
| JP | 2008-525957 A | 7/2008 |
| JP | 2009-267392 A | 11/2009 |
| JP | 2010-034315 A | 2/2010 |
| JP | 2010-177338 A | 8/2010 |
| JP | 2011-151096 A | 8/2011 |
| JP | 2011-151097 A | 8/2011 |
| WO | 99/48160 A1 | 9/1999 |
| WO | 2005/059951 A2 | 6/2005 |

\* cited by examiner () ORGANIC LIGHT-EMITTING DEVICE, COATING LIQUID FOR FORMING ORGANIC LIGHT-EMITTING DEVICE, MATERIAL FOR FORMING ORGANIC LIGHT-EMITTING DEVICE, LIGHT SOURCE DEVICE USING ORGANIC LIGHT-EMITTING DEVICE, AND ORGANIC LIGHT-EMITTING DEVICE PRODUCING METHOD

TECHNICAL FIELD

The present invention relates to organic light-emitting devices, coating liquids for forming organic light-emitting devices, materials for forming organic light-emitting devices, light source devices using organic light-emitting devices, and organic light-emitting device producing methods.

BACKGROUND ART

PTL 1 discloses an organic electroluminescent device for the purpose of providing an organic EL device or the like that has high external extraction quantum efficiency, a long emission lifetime, and low driving voltage. In the organic electroluminescent device disclosed in this publication, at least two layers A and B in the three or more organic layers provided between the cathode and the anode are formed by coating using nonaqueous solvents. The device includes a mixed region formed between the layer A and the layer B, and the concentration distribution of the constituent component of the layer A or B has a continuous concentration gradient.

PTL 2 discloses a material for organic electronics that can be used to easily form multiple layers by coating, and that can increase the efficiency and the lifetime of an organic EL device, and lower the driving voltage. The material is a mixture containing a first hole transport material and a second hole transport material. The first hole transport material is a polymer or an oligomer having at least one polymerizable substituent and a hole transporting repeating unit within the molecule. The difference in the work functions of the first hole transport material and the second hole transport material is 0.5 eV or less.

PTL 3 discloses an organic electroluminescent device for the purpose of providing an organic EL light-emitting device that has high emission luminance, a few dark spots, and a long lifetime. The organic electroluminescent device disclosed in this publication includes a cathode and an anode on a substrate, and more than one organic layers disposed between the cathode and the anode. At least one of the organic layers is a layer that contains an organic molecule having 10 or less repeating units, and that is obtained by applying and polymerizing a compound having at least one polymerizable group.

CITATION LIST

Patent Literature

PTL 1: JP-A-2007-42314
PTL 2: JP-A-2009-267392
PTL 3: JP-A-2006-279007

SUMMARY OF THE INVENTION

Technical Problem

A problem of conventional organic light-emitting devices that include a mixed layer of a light-emitting layer and a charge transport layer is that the mixed layer does not include desirable functional groups, and it is difficult to control the concentration of the dopant contained in the mixed layer.

It is an object of the present invention to provide an organic light-emitting device material with which the dopant concentration can be easily controlled, a coating liquid for forming an organic light-emitting device using the organic light-emitting device material, an organic light-emitting device using the coating liquid for forming an organic light-emitting device, a light source device using the organic light-emitting device, and methods for producing these.

Solution to Problem

An organic light-emitting device of the present invention is configured as follows. An organic layer includes a charge transport layer and a mixed layer in contact with the charge transport layer. The mixed layer includes a host, a first dopant, and a charge transporting material. The first dopant includes a first functional group. The charge transporting material includes a second functional group. The first dopant is drawn to a charge transport layer contact surface where the mixed layer is in contact with the charge transport layer. The charge transporting material is drawn to a mixed layer surface other than the charge transport layer contact surface.

Advantageous Effects

The present invention can provide an organic light-emitting device material with which the concentration of the molecule contained in the mixed layer can be easily controlled, a coating liquid for forming an organic light-emitting device using the organic light-emitting device material, an organic light-emitting device using the coating liquid for forming an organic light-emitting device, a light source device using the organic light-emitting device, and methods for producing these.

DESCRIPTION OF EMBODIMENTS

Figure 1:
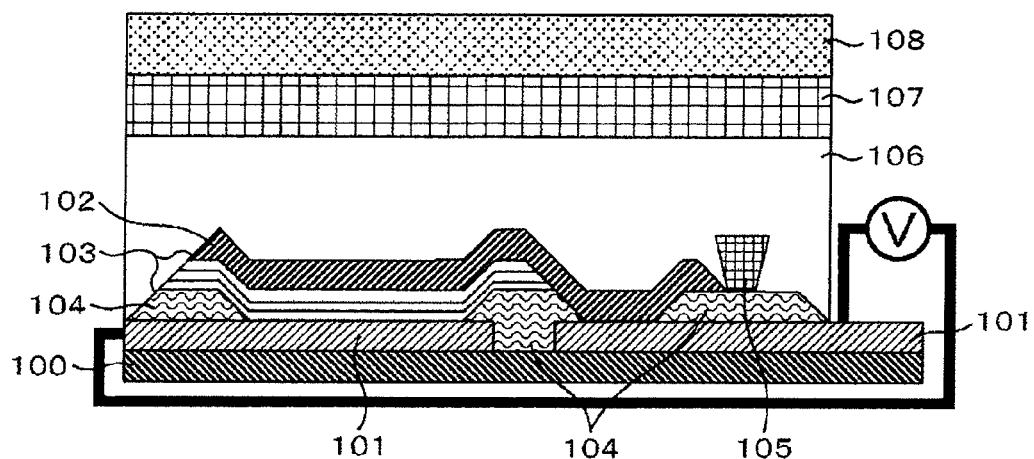
FIG. 1 is a cross sectional view representing an example of a light source device.

The following describes an organic light-emitting device, a coating liquid for forming an organic light-emitting device, a material for forming an organic light-emitting device, a light source device using the organic light-emitting device, and a method for producing the organic light-emitting device.

The organic light-emitting device is a device that includes a lower electrode, an, upper electrode, and an organic layer disposed between the lower electrode and the upper electrode. The organic layer includes a charge transport layer, and a mixed layer in contact with the charge transport layer. The mixed layer includes a host, a first dopant, and a charge transporting material. The first dopant includes a first functional group. The charge transporting material includes a second functional group. The first dopant is drawn to the charge transport layer contact surface where the mixed layer is in contact with the charge transport layer. The charge transporting material is drawn to the mixed layer surface other than the charge transport layer contact surface.

It is desirable in the organic light-emitting device that the host includes a third functional group, and that the third functional group is drawn to, the charge transport layer contact surface of the mixed layer.

It is desirable in the organic light-emitting device that the charge transport layer is formed on a surface of the lower electrode, the mixed layer is formed on a surface of the charge transport layer, and the upper electrode is formed on a surface of the mixed layer.

It is desirable in the organic light-emitting device that the second functional group is at least one functional group selected from the group consisting of a fluoroalkyl group, a perfluoroalkyl group, an alkyl group (of 10 or more carbon atoms), a perfluoropolyether group, and a siloxy group.

It is desirable in the organic light-emitting device that the mixed layer is formed on a surface of the lower electrode, the charge transport layer is formed on a surface of the mixed layer, the upper electrode is formed on a surface of the charge transport layer, the first functional group is at least one functional group selected from the group consisting of a fluoroalkyl group, a perfluoroalkyl group, an alkyl group (of 10 or more carbon atoms), a perfluoropolyether group, and a siloxy group, and the third functional group is at least one functional group selected from the group consisting of a fluoroalkyl group, a perfluoroalkyl group, an alkyl group (of 10 or more carbon atoms), a perfluoropolyether group, and a siloxy group.

It is desirable in the organic light-emitting device that the mixed layer contains an electron-donating material or an electron-accepting material.

It is desirable in the organic light-emitting device that the mixed layer contains a second dopant, and that the emission color of one of the first dopant and the second dopant is red, and the other emission color is green.

It is desirable in the organic light-emitting device that the mixed layer contains a second dopant and a third dopant, and that the first dopant has a different emission color from the emission color of the second dopant, and that the third dopant has a different emission color from the emission colors of the first and second dopants.

It is desirable in the organic light-emitting device that the second dopant and the third dopant include a first functional group.

The coating liquid for forming an organic light-emitting device is a coating liquid used to form the organic light-emitting device of claim 1, and includes a host, a first dopant, a charge transporting material, and a solvent.

The material for forming an organic light-emitting device is a material used to form the organic light-emitting device of claim 1, and includes a host, a first dopant, and a charge transporting material.

The light source device includes the organic light-emitting device.

It is desirable in the light source device that the organic light-emitting device emits white light.

The light source device includes a first organic light-emitting device and a second organic light-emitting device. It is desirable that the first organic light-emitting device is the organic light-emitting device described above, and that the mixed layer includes a second dopant, and the emission color of one of the first dopant and the second dopant is red, and the other emission color is green. It is desirable that the second organic light-emitting device is the organic light-emitting device described above, and that the mixed layer includes a blue dopant instead of the first dopant, and the blue dopant includes the first functional group.

It is desirable in the light source device that a bank is provided in a side surface portion of the organic light-emitting device, and that a water-repellent layer is formed on the surface of the bank on the mixed layer side.

The organic light-emitting device producing method is a method for producing an organic light-emitting device that includes a lower electrode, an upper electrode, and an organic layer disposed between the lower electrode and the upper electrode. The organic layer includes a charge transport layer, and a mixed layer in contact with the charge transport layer. The mixed layer contains a host, a first dopant, and a charge transporting material. The first dopant includes a first functional group. The charge transporting material includes a second functional group. The first dopant is drawn to the charge transport layer contact surface where the mixed layer is in contact with the charge transport layer. The charge transporting material is drawn to the mixed layer surface other than the charge transport layer contact surface. The method forms the mixed layer by using a coating method.

The present invention is described below in greater detail with reference to the accompanying drawings, and elsewhere.

The concrete examples of implementation discussed in the following detailed explanation serve solely to represent the contents of the present invention, which should not be narrowly interpreted within the limits of such concrete examples, but rather may be applied in many variations or modifications by a person ordinary skilled in the art within the technical scope of the present invention disclosed herein. Further, in the appended figures referred to in the descriptions of the present invention, functionally same components and/or features may have the same reference numerals, and explanations thereof may be omitted to avoid redundancy.

FIG. 1 is a cross sectional view representing an example of the light source device.

The light source device shown in the figure is a top-emission light source device in which light is extracted from the upper electrode 102 side.

Referring to the figure, a lower electrode 101, an organic layer 103, and an upper electrode 102 are disposed in this order on a surface of a substrate 100. A resin layer 106, a sealing substrate 107, and a light extracting layer 108 are disposed in this order over the surface of the upper electrode 102. Though not illustrated, the light source device includes other components, such as a drive circuit, and a casing. The organic light-emitting device includes the upper electrode 102, the lower electrode 101, and the organic layer 103.

A first bank 104 is disposed on a surface of the lower electrode 101. A portion of the first bank 104 separates the lower electrode 101, and contacts the surface of the substrate 100. A second bank 105 is disposed on a portion of the surface of the first bank 104. The lower electrode 101 (right-hand side in the figure) separated by the first bank 104 is in contact with the upper electrode 102. Applying voltage between the lower electrode 101 (left-hand side in the figure) and the lower electrode 101 (right-hand side in the figure) creates a potential difference between the lower electrode 101 side and the upper electrode 102 side of the organic layer 103. The organic layer 103 emits light upon binding of electrons and holes.

In the figure, the lower electrode 101 is an anode. However, the lower electrode 101 may be a cathode. The lower electrode 101 is formed by being patterned by photolithography.

The upper electrode 102 is a cathode when the lower electrode 101 is an anode, and is an anode when the lower electrode 101 is a cathode. When the upper electrode 102 is indium tin oxide (ITO) or indium zinc oxide (IZO) and the ITO or IZO is formed by sputtering, a buffer layer may be provided between the organic layer 103 and the upper electrode 102 to alleviate the damage caused by the sputtering. Metal oxides such as molybdenum oxide and vanadium oxide are used for the buffer layer. The upper electrode 102 is connected to the lower electrode 101 of the adjacent organic light-emitting device. In this way, the organic light-emitting devices can be connected to one another in series.

The first bank 104 formed in a side surface portion of the organic light-emitting device is forward tapered, covering the end portions of the patterned lower electrode 101 to prevent partial shorting defects in the organic light-emitting device. The first bank 104 is formed by developing and exposing the organic layer 103 with a predetermined photomask after the organic layer 103 is formed by coating. The surface of the first bank 104 on the side of the organic layer 103 may be subjected to a water repellent treatment. For example, the water repellent treatment is performed by the plasma treatment of the surface of the first bank 104 using a fluorine-containing gas to fluorinate the surface of the first bank 104. As a result, a water-repellent layer is formed on the surface of the first bank 104. A photosensitive polyimide is preferably used for the first bank 104. Other materials such as acrylic resin, novolac resin, phenolic resin, and non-photosensitive material may also be used for the first bank 104. As used herein, the side surface portion of the organic light-emitting device refers to the peripheral or end portion of the plate-shaped organic light-emitting device configured as a laminate of the upper electrode 102, the lower electrode 101, and the organic layer 103. The first bank 104 is a member in contact with the peripheral or end portion of at least one of the upper electrode 102, the lower electrode 101, and the organic layer 103.

The second bank 105 is formed on the surface of the first bank 104. The second bank 105 is reverse tapered, and is used to prevent conduction between the adjacent upper electrodes 102. The second bank 105 is formed by developing and exposing the organic layer 103 with a predetermined photomask after the organic layer 103 is formed by coating. The surface of the second bank 105 on the side of the organic layer 103 may be subjected to a water repellent treatment. For example, the water repellent treatment is performed by the plasma treatment of the surface of the second bank 105 using a fluorine-containing gas to fluorinate the surface of the second bank 105. As a result, a water-repellent layer is formed on the surface of the second bank 105. A negative photoresist is preferably used for the second bank 105. Other materials such as acrylic resin, novolac resin, phenolic resin, and non-photosensitive material may also be used for the second bank 105.

The resin layer 106 is formed on the surfaces of the upper electrode 102 and the second bank 105. The resin layer 106 is provided to seal the organic light-emitting device, and prevent entry of gas and moisture that may cause deterioration in the light-emitting device. Various polymers such as epoxy resin may be used for the resin layer 106. For improved sealing performance, an inorganic passivation film on the upper electrode 102 may be used as the resin layer 106.

The sealing substrate 107 is formed on the surface of the resin layer 106. The sealing substrate 107 is a glass substrate. Other than glass, a plastic substrate with an appropriate gas barrier film also may be used.

The light extracting layer 108 is formed on the sealing substrate 107. The light extracting layer 108 is used to efficiently extract the emitted light from the organic layer 103. For example, a structure such as a microlens, and a film having scattering or diffuse reflection characteristics can be used as the light extracting layer 108.

The organic light-emitting device may be provided as a single device, or may be one of multiple devices. The multiple devices may be connected to one another by using, for example, a serial connection method, a parallel connection method, or a serial-parallel connection method. When provided as multiple organic light-emitting devices, the organic light-emitting devices may have the following forms. The first dopant, the second dopant, and the third dopant will be described later.

(a) A plurality of single organic light-emitting devices that include a first dopant, a second dopant, and a third dopant.

(b) An organic light-emitting device that includes a first dopant and a second dopant, and an organic light-emitting device that includes a third dopant.

(c) An organic light-emitting device that includes a first dopant, an organic light-emitting device that includes a second dopant, and an organic light-emitting device that includes a third dopant.

Referring to (b), by using red dopant- and green dopant-containing organic light-emitting devices with an organic light-emitting device containing a blue dopant, the influence of energy transfer can be minimized, and the organic light-emitting device containing the blue dopant can efficiently emit light. Referring to (c), by using a red dopant, a green dopant, and a blue dopant for the first dopant, the second dopant, and the third dopant, respectively, the emitted light colors from the multiple organic light-emitting devices can mix and produce white light.

Figure 4:
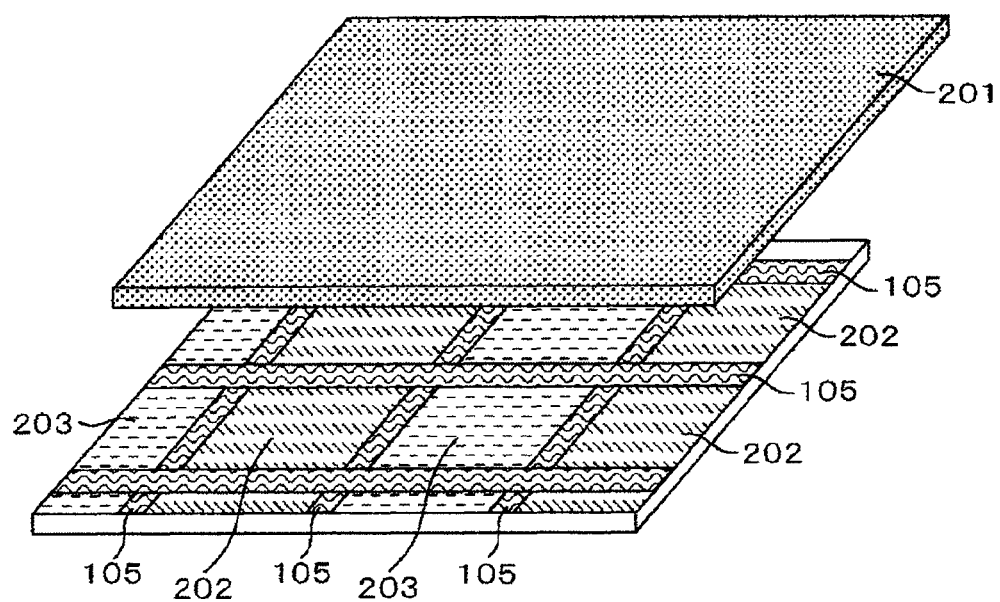
FIG. 4 is a perspective view representing an example of a light source device.

FIG. 4 is a perspective view representing an example of the light source device.

A first organic light-emitting device 202 and a second organic light-emitting device 203 are separated from each other with the second bank 105. A diffusion plate 201 is disposed in the direction where the light from the first organic light-emitting device 202 and the second organic light-emitting device 203 is extracted. Referring to FIG. 4, in the case of the configuration (b) above, the first organic light-emitting device 202 represents the organic light-emitting device that contains a red dopant and a green dopant, and the second organic light-emitting device 203 represents the organic light-emitting device that contains a blue dopant. Referring to FIG. 4, in the case of the configuration (c) above, the first organic light-emitting device 202 and the second organic light-emitting device 203 each represent any one of the organic light-emitting device that contains the red dopant, the organic light-emitting device that contains the green dopant, and the organic light-emitting device that contains the blue dopant. The organic light-emitting devices may be disposed in stripe patterns as shown in FIG. 4, or in houndstooth patterns. When the organic light-emitting devices are produced by coating, the organic light-emitting devices can be produced more easily in stripe patterns as in FIG. 4.

When devices of different colors are combined, the diffusion plate 201 may be attached over the light extracting surface of the organic light-emitting devices as in the figure to obtain desirable white light. Possible examples of the diffusion plate 201 include resin and glass in which a scattering substance is dispersed, and resin and glass having formed thereon an irregular structure.

Figure 2:
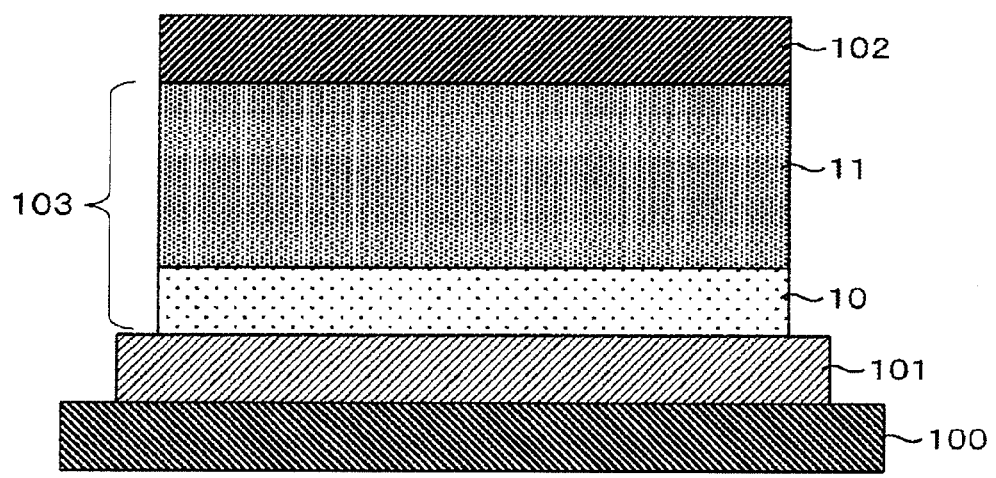
FIG. 2 is a cross sectional view representing an example of an organic light-emitting device.

FIG. 2 is a cross sectional view representing an example of the organic light-emitting device.

The organic light-emitting device shown in the figure includes a lower electrode 101, an organic layer 103, and an upper electrode 102 disposed in this order on a surface of the substrate 100. The organic light-emitting device shown in the figure is a top-emission device in which the emission of the organic layer 103 is extracted from the upper electrode 102 side. The lower electrode 101 is a reflective electrode serving as a cathode, and the upper electrode 102 is a transparent electrode serving as an anode. Note that the organic light-emitting device may have a bottom-emission device structure in which the upper electrode 102 is the reflective electrode, and the lower electrode 101 is the transparent electrode, provided that the upper electrode 102 and the lower electrode 101 are cathode and anode, respectively. The substrate 100 and the lower electrode 101, the lower electrode 101 and the organic layer 103, and the organic layer 103 and the upper electrode 102 may be in contact with each other. Layers such as an inorganic buffer layer and an injection layer may be interposed between the layers. Examples of the inorganic buffer layer include vanadium oxide, molybdenum oxide, and tungsten oxide. Examples of the injection layer include an electron injection layer, and a hole injection layer.

The organic layer 103 includes a charge transport layer 10 and a mixed layer 11. In the figure, the mixed layer 11 has a greater thickness than the charge transport layer 10. However, the thickness of the mixed layer 11 may be the same as or less than the thickness of the charge transport layer 10. In the figure, the lower electrode 101 is formed on the surface of the substrate 100, the charge transport layer 10 on the surface of the lower electrode 101, the mixed layer 11 on the surface of the charge transport layer 10, and the upper electrode 102 on the surface of the mixed layer 11.

Figure 3:
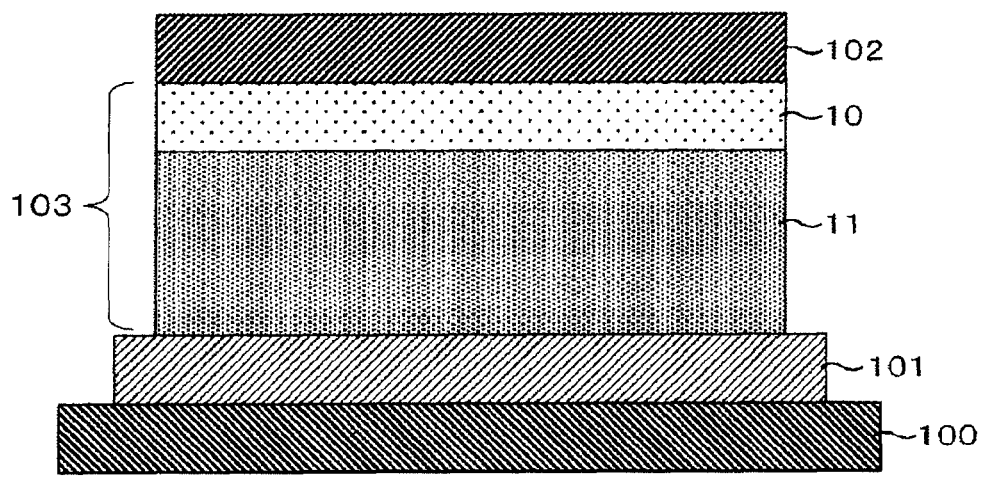
FIG. 3 is a cross sectional view representing another example of the organic light-emitting device.

FIG. 3 is a cross sectional view representing another example of the organic light-emitting device.

As shown in the figure, the mixed layer 11 may be formed on the surface of the lower electrode 101, the charge transport layer 10 on the surface of the mixed layer 11, and the upper electrode 102 on the surface of the charge transport layer 10.

The organic layer 103 may include layers other than the charge transport layer 10 and the mixed layer 11. Examples of layers other than the charge transport layer 10 and the mixed layer 11 include an electron injection layer, an electron transport layer, a hole transport layer, and a hole injection layer. More than one of these layers may be laminated. The charge transport layer 10 and the mixed layer 11 may be in contact with each other, or layers such as an inorganic buffer layer and an injection layer may be interposed between the charge transport layer 10 and the mixed layer 11.

Possible examples of the charge transport layer 10 include an electron transport layer, and a hole transport layer.

The mixed layer 11 includes a host, a first dopant, and a charge transporting material. The mixed layer 11 may include an electron-donating material or an electron-accepting material. Electrons and holes recombine in the mixed layer 11, and the mixed layer 11 emits light. Emission may occur inside the mixed layer 11, or at the interface between the mixed layer 11 and the layer adjacent to the mixed layer 11.

Examples of the first dopant include fluorescent compounds, and phosphorescent compounds. Other examples of the first dopant include a red dopant, a green dopant, and a blue dopant.

Vacuum deposition and coating are two major methods used in organic light-emitting device production. The advantages of the coating method include easy deposition over large areas, and high material utilization efficiency. The coating method requires reducing the number of layers in the organic light-emitting device, and the light-emitting layer needs to be provided as a single layer.

In an organic light-emitting device produced by using the conventional coating method, the mixed layer is formed by using the solubility difference of the materials for the solvent, and by controlling a region of the underlying layer that redissolves when being laminated. It is difficult with this method to control the concentration of the material contained in the mixed layer.

<First Functional Group>

The host includes a third functional group, and the first dopant includes a first functional group. By the effect of the first functional group, the first dopant is drawn to the surface of the mixed layer 11 on the side of the charge transport layer 10. By the effect of the third functional group, the host is drawn to the surface of the mixed layer 11 on the side of the charge transport layer 10. The host is not necessarily required to include the third functional group. However, containing the third functional group in the host makes it easier to control the first dopant concentration. The first functional group and the third functional group may be the same or different. In the following, the host and the first dopant will be described as containing the first functional groups as the same dopants. Note that, in this specification, "functional group" is also referred to as a "functional functional group".

When the charge transport layer 10 is formed between the mixed layer 11 and the upper electrode 102 as in FIG. 3, it is preferable to use, for example, a fluoroalkyl group, a perfluoroalkyl group, an alkyl group (of 10 or more carbon atoms), a perfluoropolyether group, or a siloxy group (—Si—O—Si—) as the first functional group. Considering surface energy, fluoroalkyl groups and perfluoropolyether groups are desirable, and perfluoroalkyl groups are further desirable. The host and the first dopant contain any one of these functional groups, and may contain more than one functional groups. These groups may be introduced either directly to the backbone, or via amide bonds, ester bonds, and the like as in the following chemical formula (Chem. 1).

[Chem. 1]

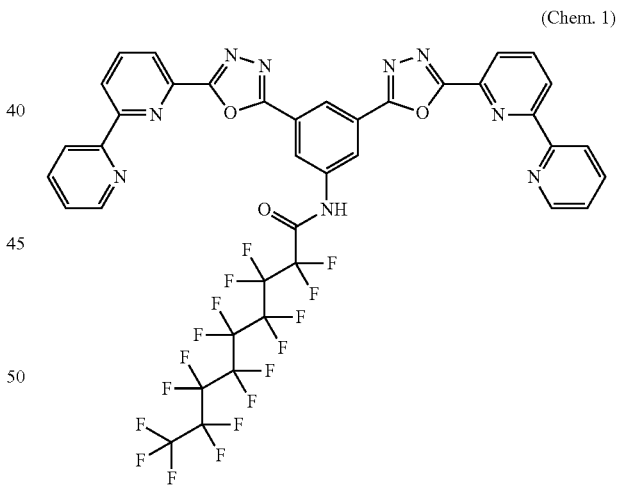

(Chem. 1)

When the host and the first dopant are given fluorine-containing substituents, increasing the number of fluorine atoms makes the host and the first dopant in the mixed layer 11 more concentrated on the side of the charge transport layer 10. Specifically, it is desirable that at least seven fluorine atoms are contained in the substituents.

With the first functional groups added to the host and the first dopant, the host and the first dopant in the mixed layer 11 are concentrated and localized on a surface on the side of the upper electrode 102. That is, the host and the first dopant form a concentration gradient in the mixed layer 11. With the first functional groups added to the host and the first dopant, the host and first dopant concentration in the mixed layer 11 peaks on the side of the upper electrode 102 relative to the center of the mixed layer 11 in the thickness direction of the mixed layer 11. The host and first dopant concentration monotonically decreases from its peak toward the lower electrode 101 in the thickness direction of the mixed layer 11.

When the charge transport layer 10 is formed between the mixed layer 11 and the lower electrode 101 as in FIG. 2, the first functional group may be selected as follows according to the type of the underlayer in contact with the mixed layer 11 on the side of the lower electrode 101.

When the underlayer is the hole transport layer, the first functional group is given a structure similar to the hole transport layer. Specific examples include phenylamino groups, carbazole groups, and hydrazone moieties.

When the underlayer is the electron transport layer, the first functional group is given a structure similar to the electron transport layer. Specific examples include oxadiazole groups, triazole groups, and phenanthroline moieties.

When the underlayer is an electrode such as ITO and metal, the first functional group may be, for example, a hydroxyl group (—OH), a thiol group (—SH), a carboxyl group (—COOH), a sulfo group (—SO$_3$H), I, Br, Cl, F, SCN, CN, NH$_2$, NO$_2$, or a bipyridyl group. These groups may be introduced either directly to the backbone as in the following chemical formula (Chem. 2), or via, for example, amide bonds, ester bonds, or alkyl chains as selected according to the size of the molecule, as in the following chemical formula (Chem. 3). The host and the first dopant necessarily contain any one of these functional groups, and may contain more than one functional groups.

[Chem. 2]

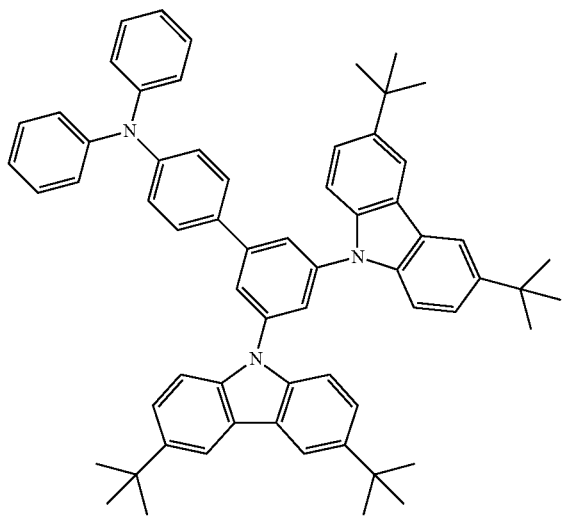

(Chem. 2)

[Chem. 3]

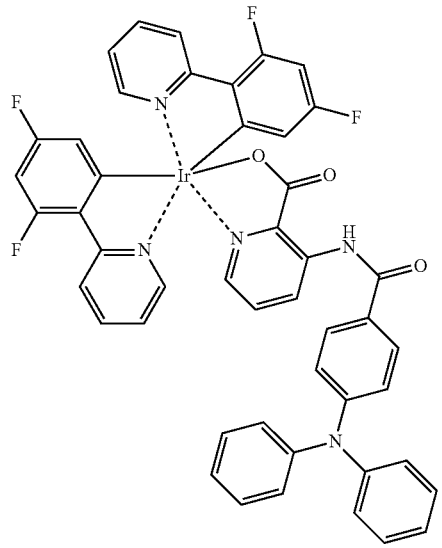

(Chem. 3)

By the addition of the functional groups, the host and the first dopant are concentrated and localized on the lower electrode 101 side of the mixed layer 11. Specifically, the host and the first dopant form a concentration gradient in the mixed layer 11. In this case, the host and first dopant concentration in the mixed layer 11 peaks on the side of the lower electrode 101 relative to the center of the mixed layer 11 in the thickness direction of the mixed layer 11. The host and first dopant concentration monotonically decreases from its peak toward the upper electrode 102 in the thickness direction of the mixed layer 11.

The mixed layer 11 may contain a second dopant. In this case, it is desirable that the second dopant and the first dopant have different emission colors. The second dopant may contain the first functional group. As used herein, "different emission colors" means different maximum intensity wavelengths in the PL spectra of the dopants. When the mixed layer 11 contains the first dopant and the second dopant, it is desirable that the emission color of one of the first dopant and the second dopant is red, and the other emission color is green. In this way, the influence of energy transfer can be minimized. The organic light-emitting device can emit white light by adjusting the maximum intensities of the first dopant and the second dopant in the PL spectra.

The mixed layer 11 may further contain a third dopant. In this case, it is desirable that the third dopant has a different emission color from the emission colors of the first and second dopants. The third dopant may contain a first functional group. For reasons related to the lowest triplet excitation energy (T1 energy), the presence of a dopant in the charge transport layer region of the mixed layer 11 does not necessarily produce efficient emission. It is therefore desirable that the first dopant, the second dopant, and the third dopant contain the first functional groups to ensure that the dopants are contained in the light-emitting layer region of the mixed layer 11. For example, when the first dopant, the second dopant, and the third dopant are a red dopant, a green dopant, and a blue dopant, respectively, the organic light-emitting device can emit white light with the single mixed layer 11. When the first dopant, the second dopant, and the third dopant contain the first functional groups, the same or different functional groups may be selected for these dopants from the first functional groups exemplified above.

Dopants of different colors are surrounded by one another when the red dopant, the green dopant, and the blue dopant are mixed in the single mixed layer 11 to produce white emission. Excitation energy transfers to the adjacent molecule in a certain probability. When the greed dopant or red dopant is present adjacent to the blue dopant, the excitation energy transfers to the lower energy side of the green dopant or red dopant from the blue dopant, making it difficult to produce white emission. Thus, when the red dopant, the green dopant, and the blue dopant are contained in the single mixed layer 11, it is desirable that the first functional group is given to the red dopant and the green dopant, not to the blue dopant.

<Second Functional Group>

The charge transporting material contains the second functional group. By the effect of the second functional group, the charge transporting material is drawn to the surface of the mixed layer 11 away from the charge transport layer 10. The directions toward and away from the charge transport layer 10 are with respect to the thickness direction of the organic light-emitting device.

When the charge transport layer 10 is formed between the mixed layer 11 and the lower electrode 101 as in FIG. 2, the second functional group is preferably, for example, a fluoroalkyl group, a perfluoroalkyl group, an alkyl group (of 10 or more carbon atoms), a perfluoropolyether group, or a siloxy group (—Si—O—Si—). Considering surface energy, fluoroalkyl groups and perfluoropolyether groups are desirable, and perfluoroalkyl groups are further desirable. The charge transporting material necessarily contains any one of these functional groups, and may contain more than one functional groups. These groups may be introduced either directly to the backbone, or via amide bonds, ester bonds, and the like as in the chemical formula (Chem. 1).

When the charge transporting material is given fluorine-containing substituents, increasing the number of fluorine atoms makes the charge transporting material in the mixed layer 11 more concentrated toward the surface away from the charge transport layer 10. Specifically, it is desirable that at least seven fluorine atoms are contained in the substituents.

With the second functional group added to the charge transporting material, the charge transporting material in the mixed layer 11 is concentrated and localized toward the upper electrode 102. That is, the charge transporting material forms a concentration gradient in the mixed layer 11. The concentration of the charge transporting material peaks on the side of the upper electrode 102 relative to the center of the mixed layer 11 in the thickness direction of the mixed layer 11. The concentration of the charge transporting material monotonically decreases from its peak toward the lower electrode 101 in the thickness direction of the mixed layer 11.

When the charge transport layer 10 is formed between the mixed layer 11 and the upper electrode 102 as in FIG. 3, the second functional group may be selected as follows according to the type of the underlayer in contact with the mixed layer 11 on the side of the lower electrode 101.

When the underlayer is the hole transport layer, the second functional group is given a structure similar to the hole transport layer. Specific examples include phenylamino groups, carbazole groups, and hydrazone moieties.

When the underlayer is the electron transport layer, the second functional group is given a structure similar to the electron transport layer. Specific examples include oxadiazole groups, triazole groups, and phenanthroline moieties.

When the underlayer is an electrode such as ITO and metal, the second functional group is preferably, for example, a hydroxyl group (—OH), a thiol group (—SH), a carboxyl group (—COOH), a sulfo group (—SO$_3$H), I, Br, Cl, F, SCN, CN, NH$_2$, NO$_2$, or a bipyridyl, group. These groups may be introduced either directly to the backbone as in the chemical formula (Chem. 2), or via, for example, amide bonds, ester bonds, or alkyl chains as selected according to the size of the molecule, as in the chemical formula (Chem. 3). The charge transporting material necessarily contains any one of these functional groups, and may contain more than one functional groups.

By the addition of these functional groups, the charge transporting material is concentrated or localized on the lower electrode 101 side of the mixed layer 11. That is, the charge transporting material forms a concentration gradient in the mixed layer 11. In this case, the concentration of the charge transporting material peaks on the side of the lower electrode 101 relative to the center of the mixed layer 11 in the thickness direction of the mixed layer 11. The concentration of the charge transporting material monotonically decreases from its peak toward the upper electrode 102 in the thickness direction of the mixed layer 11.

Possible examples of the charge transporting material include hole transporting materials and electron transporting materials. Examples of the hole transporting materials include starburstamine compounds, stilbene derivatives, hydrazone derivatives, thiophene derivatives, and fluorene derivatives. Examples of the electron transporting materials include bis(2-methyl-8-quinolinolato)-4-(phenylphenolato) aluminum (BAlq), tris(8-quinolinolato)aluminum (Alq3), tris(2,4,6-trimethyl-3-(pyridin-3-yl)phenyl)borane (3TPYMB), 1,4-bis(triphenylsilyl)benzene (UGH2), oxadiazole derivatives, triazole derivatives, fullerene derivatives, phenanthroline derivatives, quinoline derivatives, and silole derivatives.

When the hole transporting material is used as the charge transporting material, an electron-accepting material may be added to the mixed layer 11 to lower the resistance of the mixed layer 11 and thus lower the driving voltage. Electron-accepting materials are materials that are more likely to accept electrons from molecules other than electron-accepting materials. Examples of the electron-accepting materials include 7,7,8,8-tetracyanoquinodimethane (TCNQ) derivatives. The second functional group may be contained in the electron-accepting material in the mixed layer 11. With the electron-accepting material containing the second functional group, the electron-accepting material becomes less abundant in the light-emitting layer region, and luminous efficiency can improve.

When the electron transporting material is used as the charge transporting material, an electron-donating material may be added to the mixed layer 11 to lower the resistance of the mixed layer 11 and thus lower the driving voltage of the device. Electron-donating materials are materials that are likely to release electrons (more likely to donate electrons to molecules other than electron-accepting materials). Examples of the electron-donating materials include N-ethyl-1,10-phenanthrolium (NEP) derivatives, methyltriphenylphosphonium (MTPP) derivatives, N,N,N,N-tetramethyl-p-phenylenendiamine (TMPD) derivatives, rhodamine B chloride derivatives, pyronin B chloride derivatives, and 8-hydroxyquinolinolato-lithium (Liq) derivatives. The second functional group may be contained in the electron-donating material in the mixed layer 11. With the electron-donating material containing the second functional group, the electron-donating material becomes less abundant in the light-emitting layer region, and luminous efficiency can improve.

<Layer Configuration 1>

Consider layer configuration 1 of the configuration lower electrode 101/hole transport layer (charge transport layer 10)/mixed layer 11 (light-emitting layer+electron transport layer)/upper electrode 102. Layer configuration 1 corresponds to FIG. 2. The mixed layer 11 includes the host, the first dopant, and the electron transporting material. In this case, the lower electrode 101 is the anode, and the upper electrode 102 is the cathode (top cathode). Preferably, the hole transport layer is insolubilized against a mixed layer-forming solvent to prevent it from being redissolved upon applying the mixed layer 11. For example, the materials described in PTL 2 can be used for the hole transport layer insolubilized against the mixed layer-forming solvent. The first functional groups added to the host and the first dopant move the host and the first dopant toward the lower electrode 101 side, whereas the second functional group added to the electron transporting material moves the electron transporting material toward the upper electrode 102 side. As a result, a pseudo laminate structure is formed.

With this configuration, an organic light-emitting device can be produced by coating that includes an organic layer of a pseudo three-layer structure including the mixed layer 11. Further, an organic light-emitting device can easily be formed that includes the mixed layer 11 in which the concentration distribution of each material is controlled.

<Layer Configuration 2>

Consider layer configuration 2 of the configuration lower electrode 101/electron transport layer (charge transport layer 10)/mixed layer 11 (light-emitting layer+hole transport layer)/upper electrode 102. Layer configuration 2 corresponds to FIG. 2. The mixed layer 11 includes the host, the first dopant, and the hole transporting material. In this case, the lower electrode 101 is the cathode, and the upper electrode 102 is the anode (top anode). Preferably, the electron transport layer is insolubilized against the mixed layer-forming solvent to prevent it from being redissolved upon applying the mixed layer 11. For example, the materials described in PTL 3 can be used for the electron transport layer insolubilized against the mixed layer-forming solvent. The first functional groups added to the host material and the first dopant move the host and the first dopant toward the lower electrode 101 side, whereas the second functional group added to the hole transporting material moves the hole transporting material toward the upper electrode 102 side. As a result, a pseudo laminate structure is formed.

With this configuration, an organic light-emitting device can be produced by coating that includes an organic layer of a pseudo three-layer structure including the mixed layer 11. Further, an organic light-emitting device can easily be formed that includes the mixed layer 11 in which the concentration distribution of each material is controlled.

<Layer Configuration 3>

Consider layer configuration 3 of the configuration lower electrode 101/mixed layer 11 (electron transport layer+light-emitting layer)/hole transport layer (charge transport layer 10)/upper electrode 102. Layer configuration 3 corresponds to FIG. 3. The mixed layer 11 includes the host, the first dopant, and the electron transporting material. In this case, the lower electrode 101 is the cathode, and the upper electrode 102 is the anode (top anode). The second functional group added to the electron transporting material moves the electron transporting material toward the lower electrode 101 side, whereas the first functional groups added to the host and the first dopant move the host and the first dopant toward the upper electrode 102 side. As a result, a pseudo laminate structure is formed. It is desirable to form the hole transport layer by using a method such as vapor deposition.

In this way, an organic light-emitting device can easily be formed that includes the mixed layer 11 in which the concentration distribution of each material is controlled.

<Layer Configuration 4>

Consider layer configuration 4 of the configuration lower electrode 101/mixed layer 11 (hole transport layer+light-emitting layer)/electron transport layer (charge transport layer 10)/upper electrode 102. Layer configuration 4 corresponds to FIG. 3. The mixed layer 11 includes the host, the first dopant, and the hole transporting material. In this case, the lower electrode 101 is the anode, and the upper electrode 102 is the cathode (top cathode). The second functional group added to the hole transporting material moves the hole transporting material toward the lower electrode 101 side, whereas the first functional groups added to the host and the first dopant move the host and the first dopant toward the upper electrode 102 side. As a result, a pseudo laminate structure is formed. It is desirable to form the electron transport layer by using a method such as vapor deposition.

In this way, an organic light-emitting device can easily be formed that includes the mixed layer 11 in which the concentration distribution of each material is controlled.

<Host>

Preferably, the host is, for example, a carbazole derivative, a fluorene derivative, or an arylsilane derivative. For improved emission efficiency, it is preferable that the excitation energy of the host be sufficiently larger than the excitation energy of the blue dopant. Note that excitation energy is measured by using an emission spectrum.

<Blue Dopant>

The blue dopant 7 has the maximum intensity in the 400 nm to 500 nm range of the PL spectrum at room temperature. Examples of the backbone of the blue dopant include perylene, iridium complexes (such as bis(3,5-difluoro-2-(2-pyridyl)phenyl-(2-carboxypyridyl)iridium(III)): FIrpic). From the standpoint of emission characteristics, iridium complexes represented by the following chemical formula (Chem. 4) are preferable. In the formula, X1 represents a N-containing aromatic hetero ring, and X2 represents an aromatic hydrocarbon ring or an aromatic hetero ring.

[Chem. 4]

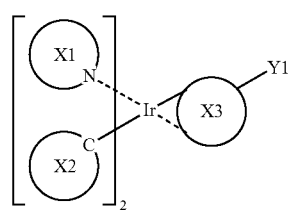

(Chem. 4)

Examples of the aromatic hetero ring represented by X1 include a quinoline ring, an isoquinoline ring, a pyridine ring, a quinoxaline ring, a thiazole ring, a pyrimidine ring, a benzothiazole ring, an oxazole ring, a benzooxazole ring, an indole ring, and an isoindole ring. Examples of the aromatic hydrocarbon ring or aromatic hetero ring represented by X2 include a benzene ring, a naphthalene ring, an anthracene ring, a thiophene ring, a benzothiophene ring, a furan ring, a benzofuran ring, and a fluorene ring. In the formula, X3 is, for example, an acetylacetonate derivative, a picolinate derivative, or a tetrakispyrazolylborate derivative. X3 may be the same as X1-X2 (the combination X1 and X2).

From the viewpoints of luminous efficiency and carrier conduction, the concentration of the blue dopant in the mixed layer 11 is preferably 10 wt % or more with respect to the host. The blue dopant has a weight-average molecular weight of desirably 500 to 3,000.

<Green Dopant>

The green dopant has the maximum intensity in the 500 nm to 590 nm range of the PL spectrum at room temperature. Examples of the backbone of the green dopant include coumalin and derivatives thereof, and iridium complexes (such as tris(2-phenylpyridine)iridium(III); hereinafter, also referred to as "Ir(ppy)3 and the like"). From the standpoint of emission characteristics, iridium complexes represented by the chemical formula (Chem. 4) are more preferable. In the formula, X1 represents a N-containing aromatic hetero ring, and X2 represents an aromatic hydrocarbon ring or an aromatic hetero ring.

Examples of the aromatic hetero ring represented by X1 include a quinoline ring, an isoquinoline ring, a pyridine ring, a quinoxaline ring, a thiazole ring, a pyrimidine ring, a benzothiazole ring, an oxazole ring, a benzooxazole ring, an indole ring, and an isoindole ring. Examples of the aromatic hydrocarbon ring or aromatic hetero ring represented by X2 include a benzene ring, a naphthalene ring, an anthracene ring, a thiophene ring, a benzothiophene ring, a furan ring, a benzofuran ring, and a fluorene ring. X3 may be, for example, an acetylacetonate derivative, or may be the same as X1-X2 (the combination X1 and X2).

From the viewpoints of luminous efficiency, suppressing energy transfer from the blue dopant, and carrier conduction, the concentration of the green dopant in the mixed layer 11 is preferably 1 wt % or less with respect to the host. The green dopant has a weight-average molecular weight of desirably 500 to 3,000.

<Red Dopant>

The red dopant has the maximum intensity in the 590 nm to 780 nm range of the PL spectrum at room temperature. Examples of the backbone of the red dopant include rubrene, (E)-2-(2-(4-(dimethylamino)styryl)-6-methyl-4H-pyran-4-ylidene)malononitrile (DCM) and derivatives thereof, iridium complexes (such as bis(1-phenylisoquinoline)(acetylacetonate)iridium(III)), osmium complexes, and europium complexes. From the standpoint of emission characteristics, the iridium complexes represented by the chemical formula (Chem. 4) are preferable. In the formula, X1 represents a N-containing aromatic hetero ring, and X2 represents an aromatic hydrocarbon ring or an aromatic hetero ring.

Examples of the aromatic hetero ring represented by X1 include a quinoline ring, an isoquinoline ring, a pyridine ring, a quinoxaline ring, a thiazole ring, a pyrimidine ring, a benzothiazole ring, an oxazole ring, a benzooxazole ring, an indole ring, and an isoindole ring. Examples of the aromatic hydrocarbon ring or aromatic hetero ring represented by X2 include a benzene ring, a naphthalene ring, an anthracene ring, a thiophene ring, benzothiophene ring, a furan ring, a benzofuran ring, and a fluorene ring. X3 is preferably, for example, an acetylacetonate derivative.

From the viewpoints of suppressing energy transfer from the blue dopant, and carrier conduction, the concentration of the red dopant in the mixed layer 11 is preferably 1 wt % or less with respect to the host. The red dopant has a weight-average molecular weight of desirably 500 to 3,000.

<Hole Injection Layer>

The hole injection layer is used to improve luminous efficiency and lifetime. The hole injection layer is also used to alleviate anode irregularities, though this is not particularly required. The hole injection layer may be provided as a single layer or multiple layers. Conductive polymers such as PEDOT (poly(3,4-ethylenedioxythiophene)):PSS (polystyrenesulfonate) are preferably used for the hole injection layer. Other polymer materials, such as polypyrrole materials and triphenylamine materials also may be used. Phthalocyanine compounds and starburstamine compounds, commonly used in combination with low-molecular materials (weight-average molecular weight of 10,000 or less), also may be used.

<Hole Transport Layer>

The hole transport layer is used for the supply of holes to the light-emitting layer. In the broad sense, the hole injection layer and the electron blocking layer also are classified into the hole transport layer. The hole transport layer may be provided as a single layer or multiple layers. For example, starburstamine compounds, stilbene derivatives, hydrazone derivatives, thiophene derivatives, and fluorene derivatives may be used for the hole transport layer. These materials are non-limiting examples, and may be used in a combination of two or more. An electron-accepting material may be added to the hole transport layer to lower the resistance of the hole transport layer and thus lower the driving voltage.

<Electron Transport Layer>

The electron transport layer is a layer that supplies electrons to the light-emitting layer. In the broad sense, the electron injection layer and the hole blocking layer also are classified into the electron transport layer. The electron transport layer may be provided as a single layer or multiple layers. Examples of the material of the electron transport layer include bis(2-methyl-8-quinolinolato)-4-(phenylphenolato) aluminum (BAlq), tris(8-quinolinolato)aluminum (Alq3), tris(2,4,6-trimethyl-3-(pyridin-3-yl)phenyl)borane (3TPYMB), 1,4-bis(triphenylsilyl)benzene (UGH2), oxadiazole derivatives, triazole derivatives, fullerene derivatives, phenanthroline derivatives, quinoline derivatives, and silole derivatives. An electron-donating material may be added to the electron transport layer to lower the resistance of the electron transport layer and thus lower the driving voltage of the device.

<Electron Injection Layer>

The electron injection layer improves the efficiency of the electron injection from the cathode to the electron transport layer. Specifically, it is desirable to use lithium fluoride, magnesium fluoride, calcium fluoride, strontium fluoride, barium fluoride, magnesium oxide, and aluminum oxide. These materials are non-limiting examples, and may be used in a combination of two or more.

<Substrate>

The substrate 100 may be, for example, a glass substrate, a metal substrate, or a plastic substrate with inorganic materials such as $SiO_2$, $SiN_x$, and $Al_2O_3$. Examples of the metal substrate material include alloys such as stainless steel, and 42 alloy. Examples of the plastic substrate material include polyethylene terephthalate, polyethylene naphthalate, polymethylmethacrylate, polysulfone, polycarbonate, and polyimide.

<Anode>

Materials with high work function can be used as the anode material. Specific examples of the materials that can be used as the transparent electrode include conductive oxides such as ITO and IZO, and metals having large work function (such as thin silver). Examples of the reflective electrode include a laminate of ITO on an Al surface, an ITO/Ag/ITO laminated film, Cr, and Mo. Typically, the electrode may be patterned on a surface of a substrate such as glass by photolithography in the case of the lower electrode, or by using a metal mask during the deposition in the case of the upper electrode.

<Cathode>

Metals having small work function are preferably used as cathode material. Specifically, for example, a laminate of LiF and Al, and a Mg:Ag alloy are preferably used as the reflective electrode material. Examples of the transparent cathode material include a thin Mg:Ag alloy, a laminate of a thin Mg:Ag alloy laminated on an ITO surface, and a laminate of LiF and IZO. These materials are non-limiting examples, and, for example, Cs compounds, Ba compounds, and Ca compounds may be used instead of LiF. The electrode can be patterned in the same way as for the patterning of the anode.

<Coating Liquid for Forming Organic Light-Emitting Device>

The coating liquid for forming an organic light-emitting device is a solution of the host, the charge transporting material, and the dopant dissolved in a suitable solvent. The material for forming an organic light-emitting device includes the host, the dopant, and the charge transporting material. The solvent is not limited, as long as it can dissolve the materials used. Examples include aromatic hydrocarbon solvents such as toluene, ether solvents such as tetrahydrofuran, alcohols, and fluorine solvents. Mixed solvents of different solvents also may be used to adjust the solubility and the drying speed of the materials.

Examples of the coating method used to deposit the mixed layer 11 include spin coating, casting, dip coating, spray coating, screen printing, and inkjet printing. Any one of these methods is used to form the mixed layer 11.

The contents of the present invention are described below in greater detail using specific examples.

Example 1

A white-emitting device of the structure shown in FIG. 2 was produced as a first example of the present invention. An ITO electrode was used as the lower electrode 101, and a polymeric material as the hole transport layer (charge transport layer 10). The mixed layer 11 used the host material of the chemical formula (Chem. 2), the blue dopant of the chemical formula (Chem. 3), the green dopant of the chemical formula (Chem. 5) below, the red dopant of the chemical formula (Chem. 6) below, and the electron transporting material of the chemical formula (Chem. 1). The weight ratio of these materials was 100:10:1:1:100. The host material, the blue dopant material, the green dopant material, the red dopant material, and the electron transporting material were dissolved in toluene to produce a coating liquid. The solid content concentration of the coating liquid was 1 wt. %. The coating liquid was used to form the mixed layer 11, using a spin coating method. Thereafter, PEDOT was formed as the hole injection layer on the surface of the mixed layer 11 by using a spin coating method. Then, a laminate of LiF and Al was formed as the upper electrode 102 to produce the organic light-emitting device.

[Chem. 5]

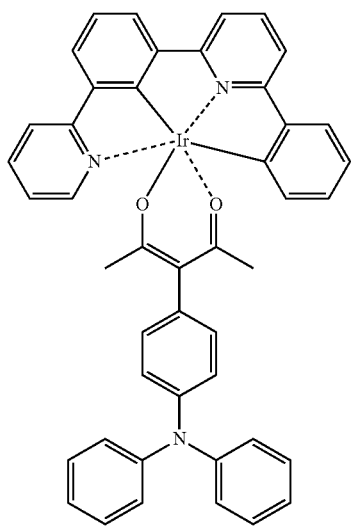

(Chem. 5)

[Chem. 6]

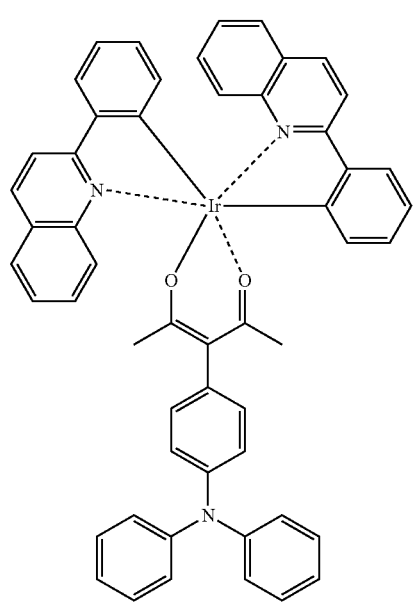

(Chem. 6)

As a comparative example, an organic light-emitting device was produced under the same conditions, using material that did not include the functional group. The organic light-emitting device of the example under applied voltage had more desirable emission characteristics than the organic light-emitting device of the comparative example.

Example 2

A light source device as a second example of the present invention was produced by connecting a plurality of organic light-emitting devices. The produced device is a combination of the device (RG device) containing the red dopant and the green dopant, and the device (B device) containing the blue dopant of Example 1. These devices were produced in the same manner as in Example 1, except that the films were produced by using an inkjet method. A diffusion plate was attached to the emission surface of the device to obtain uniform white light. The product light source device produced desirable white light.

REFERENCE SIGNS LIST

10: Charge transport layer
11: Mixed layer
100: Substrate
101: Lower electrode
102: Upper electrode
103: Organic layer
104: First bank
105: Second bank
106: Resin layer
107: Sealing substrate
108: Light extracting layer
201: Diffusion plate
202: First organic light-emitting device
203: Second organic light-emitting device

The invention claimed is:

1. An organic light-emitting device comprising
a lower electrode,
an upper electrode, and
an organic layer disposed between the lower electrode and the upper electrode,
the organic layer including a charge transport layer and a mixed layer in contact with the charge transport layer,
wherein the charge transport layer is formed on a surface of the lower electrode, the mixed layer is formed on a surface of the charge transport layer, and the upper electrode is formed on a surface of the mixed layer,
the mixed layer including a host, a first dopant, and a charge transporting material, the first dopant including a first functional group,
the charge transporting material including a second functional group that is at least one functional group selected from the group consisting of a fluoroalkyl group, a perfluoroalkyl group, an alkyl group of 10 or more carbon atoms, a perfluoropolyether group, and a siloxy group,
the first dopant being drawn to a charge transport layer contact surface where the mixed layer is in contact with the charge transport layer by the effect of the first functional group, the first dopant concentration in the mixed layer peaks on the side of the lower electrode relative to the center of the mixed layer and monotonically decreases from its peak toward the upper electrode in the thickness direction of the mixed layer,
the charge transporting material being drawn to a mixed layer surface other than the charge transport layer contact surface by the effect of the second functional group, and
the charge transporting material concentration in the mixed layer peaks on the side of the upper electrode relative to the center of the mixed layer and monotonically decreases from its peak toward the lower electrode in the thickness direction of the mixed layer.

2. The organic light-emitting device according to claim 1, wherein the host includes a third functional group, and is drawn to the charge transport layer contact surface of the mixed layer.

3. The organic light-emitting device according to claim 2, wherein the mixed layer is formed on a surface of the lower electrode, the charge transport layer is formed on a surface of the mixed layer, and the upper electrode is formed on a surface of the charge transport layer, wherein the first functional group is at least one functional group selected from the group consisting of a fluoroalkyl group, a perfluoroalkyl group, an alkyl group (of 10 or more carbon atoms), a perfluoropolyether group, and a siloxy group, and wherein the third functional group is at least one functional group selected from the group consisting of a fluoroalkyl group, a perfluoroalkyl group, an alkyl group (of 10 or more carbon atoms), a perfluoropolyether group, and a siloxy group.

4. The organic light-emitting device according to claim 1, wherein the mixed layer contains an electron-donating material or an electron-accepting material.

5. The organic light-emitting device according to claim 1, wherein the mixed layer includes a second dopant, the emission color of one of the first dopant and the second dopant being red, and the other emission color being green.

6. The organic light-emitting device according to claim 1, wherein the mixed layer includes a second dopant and a third dopant, the first dopant and the second dopant having different emission colors, and the third dopant having a different emission color from the emission colors of the first dopant and the second dopant.

7. The organic light-emitting device according to claim 6, wherein the second dopant and the third dopant include the first functional group.

8. A coating liquid for forming an organic light-emitting device used for forming the organic light-emitting device of claim 1, wherein the coating liquid comprises the host, the first dopant, the charge transporting material, and a solvent.

9. A material for forming an organic light-emitting device used for forming the organic light-emitting device of claim 1, wherein the material for forming an organic light-emitting device comprises the host, the first dopant, and the charge transporting material.

10. A light source device comprising the organic light-emitting device of claim 1.

11. A light source device comprising the organic light-emitting device of claim 5.

12. A light source device comprising the organic light-emitting device of claim 6.

13. The light source device according to claim 11, wherein the organic light-emitting device emits white light.

14. The light source device of claim 12, wherein the organic light-emitting device emits white light.

15. A light source device comprising a first organic light-emitting device and a second organic light-emitting device,
the first organic light-emitting device being the organic light-emitting device of claim 1, wherein the mixed layer includes a second dopant, the emission color of one of the first dopant and the second dopant being red, and the other emission color being green,
the second organic light-emitting device being the organic light-emitting device of claim 1, wherein the mixed layer includes a blue dopant instead of the first dopant, the blue dopant including the first functional group.

16. The light source device according to claim 10, wherein a bank is provided in a side surface portion of the organic light-emitting device, and a water-repellent layer is formed on a bank surface on the side of the mixed layer.

17. A method for forming an organic light-emitting device that includes:
a lower electrode,
an upper electrode, and an organic layer disposed between the lower electrode and the upper electrode, the organic layer including a charge transport layer and a mixed layer in contact with the charge transport layer, wherein the mixed layer is formed on a surface of the lower electrode, the charge transport layer is formed on a surface of the mixed layer, and the upper electrode is formed on a surface of the charge transport layer, the mixed layer including a host, a first dopant, and a charge transporting material, the first dopant including a first functional group that is a least one functional group selected from the group consisting of a fluoroalkyl group, a perfluoroalkyl group, an alkyl group of 10 or more carbon atoms, a perfluoropolyether group, and a siloxy group, the charge transporting material including a second functional group, the first dopant being drawn to a charge transport layer contact surface where the mixed layer is in contact with the charge transport layer by the effect of the first functional group, the first dopant concentration in the mixed layer peaks on the side of the upper electrode relative to the center of the mixed layer and monotonically decreases from its peak toward the lower electrode in the thickness direction of the mixed layer, the charge transporting material being drawn to a mixed layer surface other than the charge transport layer contact surface by the effect of the second functional group, and the charge transporting material concentration in the mixed layer peaks on the side of the lower electrode relative to the center of the mixed layer and monotonically decreases from its peak toward the upper electrode in the thickness direction of the mixed layer, the method comprising the mixed layer by using a coating method.

18. The organic light-emitting device according to claim 1, wherein when an underlayer is a hole transport layer, the first functional group is selected from phenylamino groups, carbazole groups, and hydrazone moieties, when the underlayer is an electron transport layer, the first functional group is selected from oxadiazole groups, triazole groups, and phenanthroline moieties, and when the underlayer is an electrode such as ITO and metal, the first functional group is selected from hydroxyl group (—OH), a thiol group (—SH), a carboxyl group (—COOH), a sulfo group (—SO$_3$H), I, Br, Cl, F, SCN, CN, NH$_2$, NO$_2$, and bipyridyl group.

19. The method for forming an organic light-emitting device according to claim 17, wherein when an underlayer is a hole transport layer, the second functional group is selected from phenylamino groups, carbazole groups, and hydrazone moieties, when the underlayer is an electron transport layer, the second functional group is selected from oxadiazole groups, triazole groups, and phenanthroline moieties, and when the underlayer is an electrode such as ITO and metal, the second functional group is selected from hydroxyl group (—OH), a thiol group (—SH), a carboxyl group (—COOH), a sulfo group (—SO$_3$H), I, Br, Cl, F, SCN, CN, NH$_2$, NO$_2$, and bipyridyl group.

* * * * *